United States Patent

Bouwknegt et al.

[11] Patent Number: 5,387,137
[45] Date of Patent: Feb. 7, 1995

[54] ELECTRICAL CONNECTOR HAVING A BODY SURROUNDING THE CONNECTING PINS

[75] Inventors: Johan H. P. Bouwknegt, Utrecht; Petrus W. H. Schalk, Drunen, both of Netherlands

[73] Assignee: Berg Technology, Inc., Reno, Nev.

[21] Appl. No.: 45,783

[22] Filed: Apr. 14, 1993

[30] Foreign Application Priority Data

Apr. 22, 1992 [NL] Netherlands ............... 9200736

[51] Int. Cl.⁶ .......................................... H01R 13/405
[52] U.S. Cl. ................................. 439/736; 439/751
[58] Field of Search ............ 439/722, 736, 79, 676, 439/741, 751, 873, 733

[56] References Cited

U.S. PATENT DOCUMENTS

| | | | |
|---|---|---|---|
| 1,984,036 | 12/1934 | Schwartzmann | 439/733 |
| 4,641,908 | 1/1987 | Steffinger | 339/206 |
| 4,686,607 | 8/1987 | Johnson | 361/413 |
| 4,722,691 | 2/1988 | Gladd et al. | 439/79 |
| 4,734,043 | 3/1988 | Emert et al. | 439/736 |
| 4,860,445 | 8/1989 | Jones | 439/736 |
| 4,986,772 | 1/1991 | Fukutani | 439/892 |
| 5,037,334 | 8/1991 | Viselli et al. | 439/733 |

Primary Examiner—David L. Pirlot
Attorney, Agent, or Firm—Woodcock, Washburn, Kurtz, Mackiewicz & Norris

[57] ABSTRACT

An electrical connector, comprising a housing provided with contact elements having connecting pins extending outside the housing having a connecting end for connecting electrical wiring, and a body made of plastically deformable synthetic material with parts which extend between the connecting pins. After the body has been fitted over the connecting pins, one or more of the parts of the body extending along the connecting pins is or are plastically deformed in such a manner that a barrier is produced to prevent the removal of the body.

15 Claims, 6 Drawing Sheets

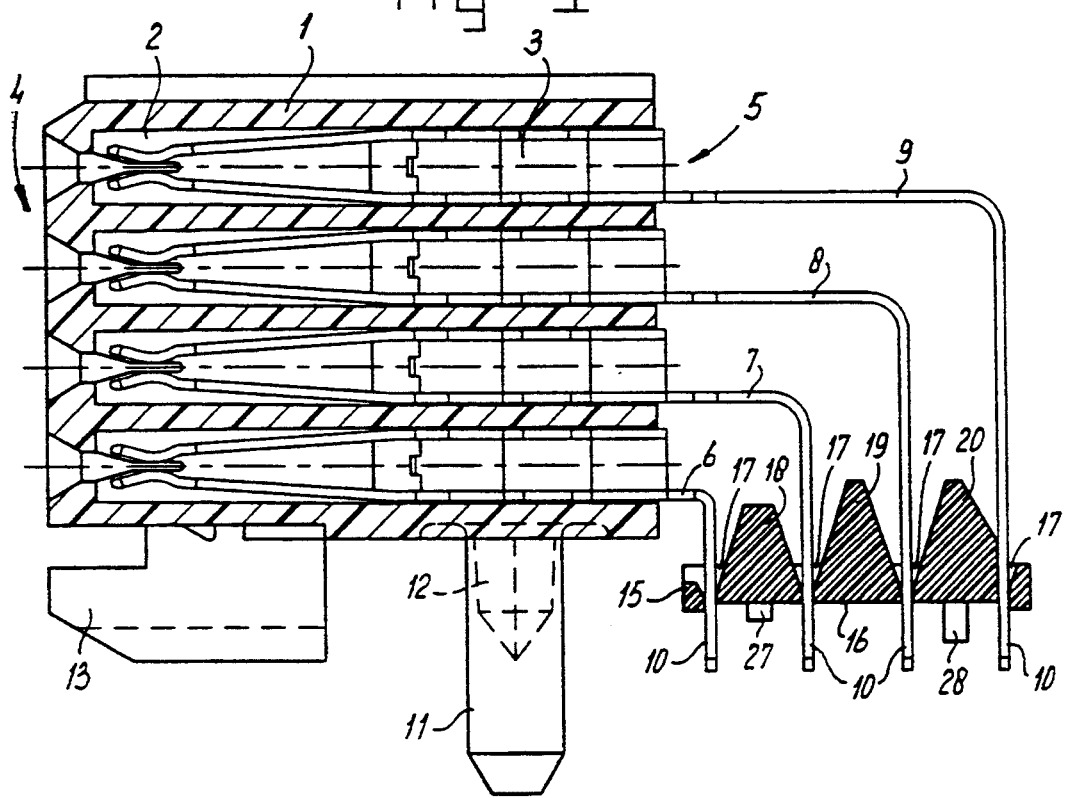
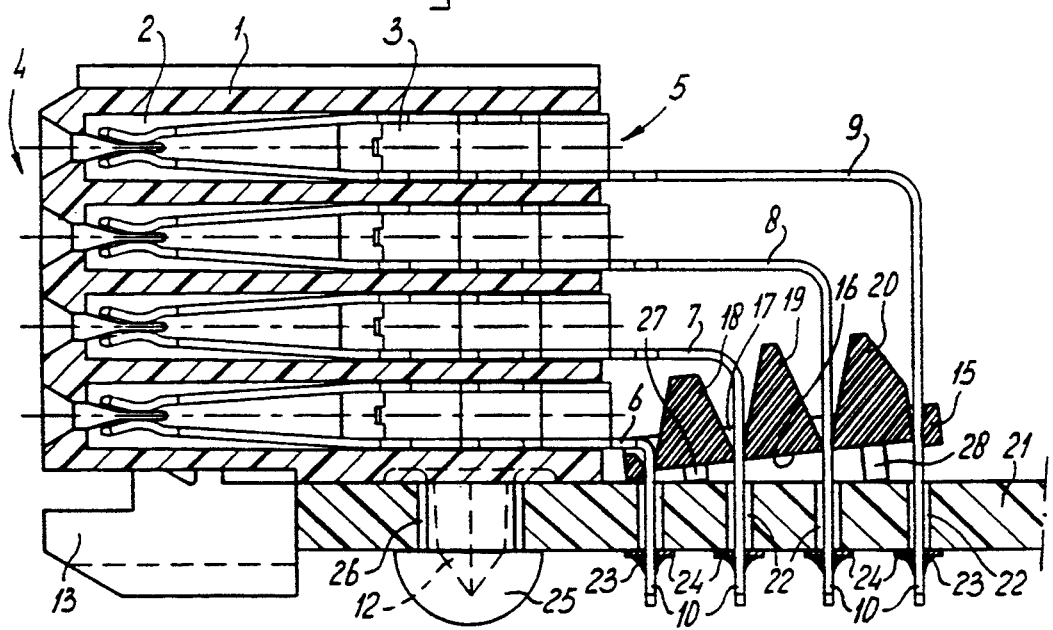

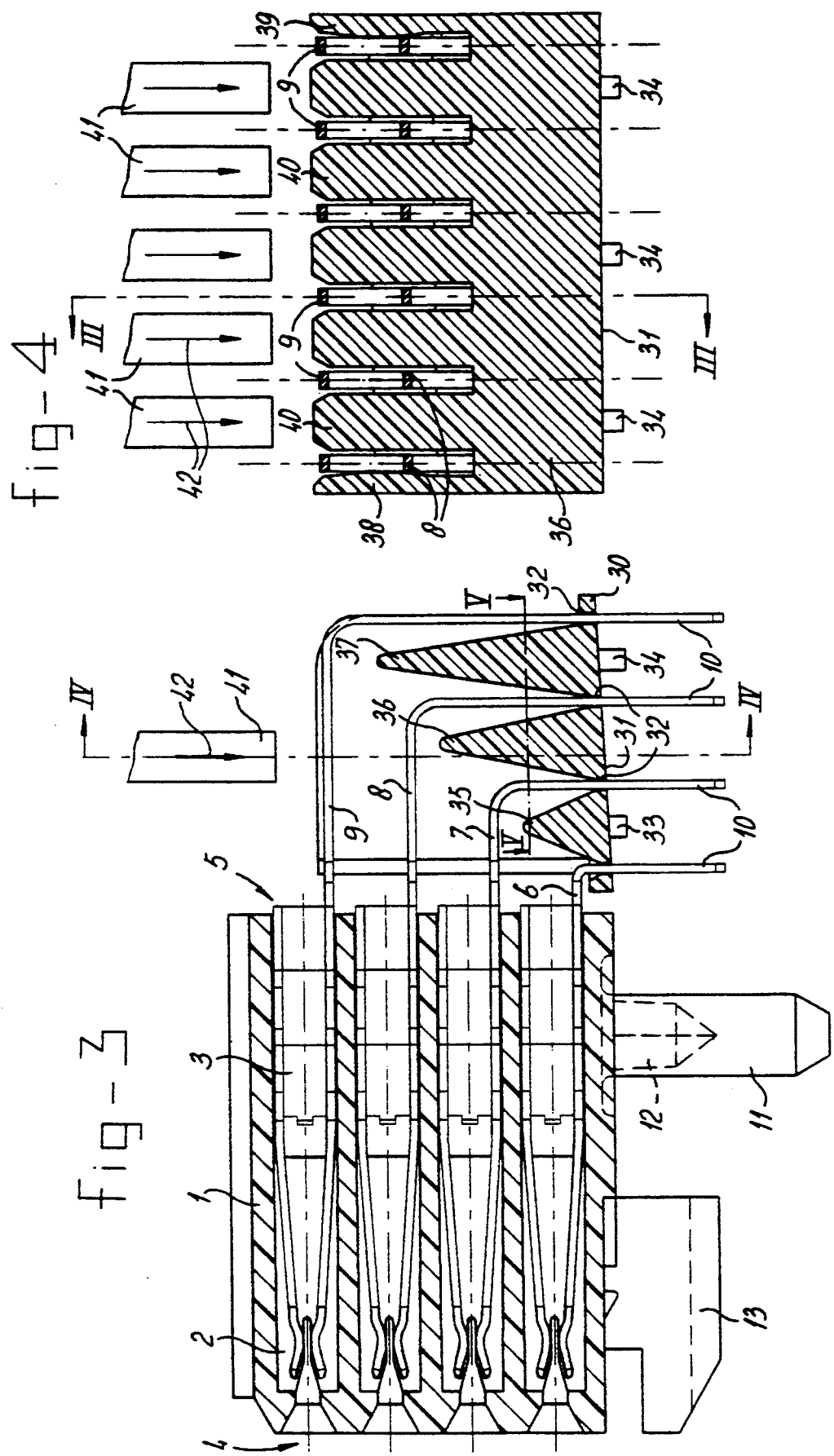

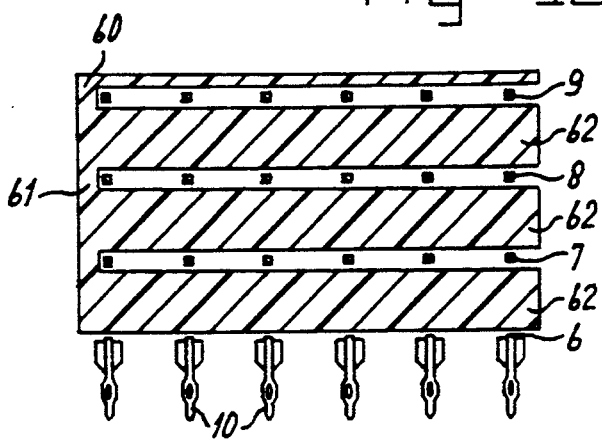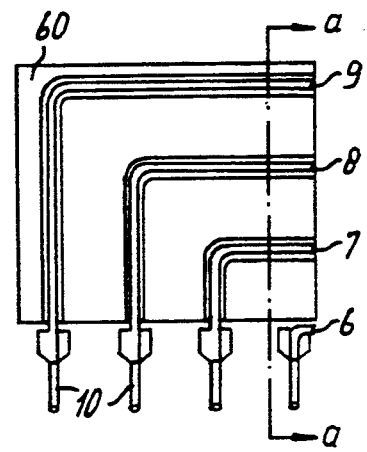
fig-10a
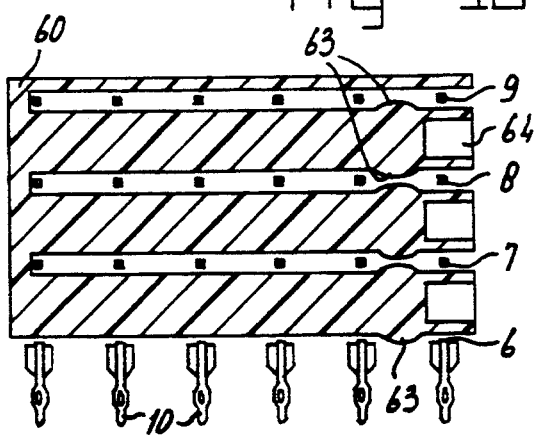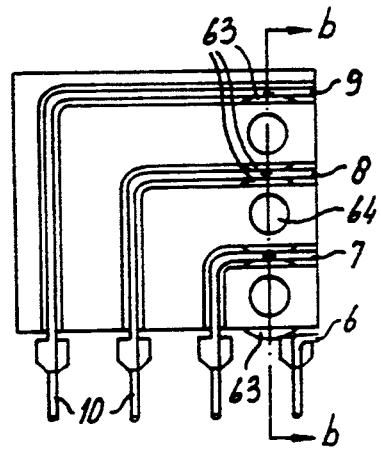
fig-10b
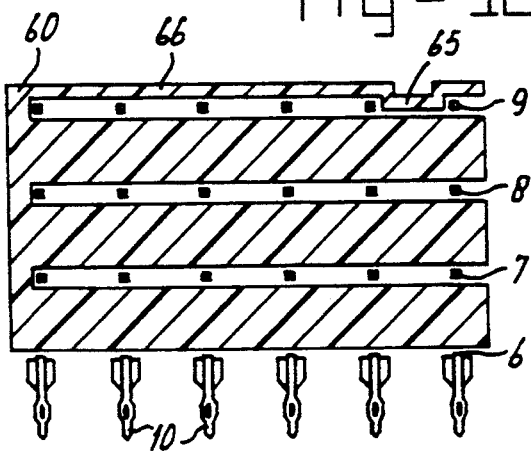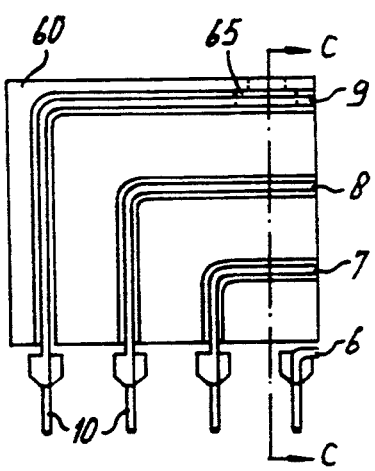
fig-10c

ELECTRICAL CONNECTOR HAVING A BODY SURROUNDING THE CONNECTING PINS

BACKGROUND OF THE INVENTION

The invention relates to an electrical connector, comprising a housing of electrically insulating material provided with a plurality of contact elements of electrically conducting material, each having a contact side for making contact to a further connector and a connecting side in the form of connecting pins extending outside the housing and having a connecting end for mounting on a printed circuit board, and having a body of plastically deformable synthetic material provided with parts which extend between the respective connecting pins.

Electrical connectors provided with a body surrounding the connecting pins as described above are known per se in practice. Such a body is referred to by the term "wafer".

In practice, two types of bodies surrounding the connecting pins of a connector can be distinguished, i.e. bodies which essentially surround the connecting ends of the connecting pins and bodies which extend over the entire connecting side of the connector between the connecting pins.

Bodies of the type first mentioned, such as disclosed by U.S. Pat. No. 4,686,607 essentially have the object of preventing deviations in the predetermined mutual pitch spacing of the connecting ends of the connecting pins, for example caused by bending during transportation or assembly of the connector, in order to facilitate the electrical connection of the connecting ends in correspondingly spaced openings and/or connecting pads on a printed circuit board, which is advantageous, in particular, in connectors having a large number of contact elements and in machine assembly using, for example, an assembly robot.

The bodies of the second type, such as disclosed by U.S. Pat. No. 4,986,772 provide, in addition to maintaining the desired positioning of the connecting ends, also an electrical and mechanical protection for the connecting pins, so that, for example, mutual short circuiting between connecting pins is effectively prevented. Undesirable touching of one or more connecting pins can also be effectively prevented in this way. It will be clear that the bodies of the second type have a larger size than the bodies of the first type described above. The bodies of the second type can also be used to introduce the contact elements into the housing of the connector.

In order to guarantee an optimum positioning of the connecting ends of the connecting pins, it is advantageous to keep the bodies during transportation and assembly of the connectors as close as possible to the connecting ends of the connecting pins. During mounting on a printed circuit board, the body is then pushed upwards along the connecting ends, so that it rests on the board. The connecting ends are then free to be electrically connected to the respective terminal pads of the printed circuit board.

The holding of the body between the connecting ends is achieved in practice by giving one or more of the through openings of the body dimensions which are such that the respective connecting ends fit therein with a clamping action. The clamping fixing obtained in this way is generally sufficient both to hold the body in place and to make it slidable during the assembly of the connector.

The disadvantage of this method of fixing is the narrow tolerance requirements between the through openings of the body and the connecting pins of the connector. When the body is being fitted, the longer pins must be adequately supported to prevent bending or deformation of said pins during assembly of the body, that is to say the fitting of the connecting ends in the through holes with a clamping action. For these reasons, only one or more of the through openings is or are designed as a clamping fit for receiving the shortest connecting pins, in general those situated closest to the connecting side of the connector housing. It has been found that this can provide an adequate holding force for the above-described bodies of the first type.

For the more extensive protective bodies of the second type mentioned, which, to surround an identical number of connecting pins, are consequently proportionally more heavy in weight than the bodies of the first type, the clamping-fit design of one or more of the through openings of the body for receiving the shortest connecting pins of a connector is in general not adequate. There is the danger that the body, as a consequence of its greater weight, slides off the connecting pins. The clamping-fit design of a plurality of through openings of the body again entails the above-described disadvantage of narrower tolerances and the risk of connecting pins bending while the body is being fitted and during assembly on the printed circuit board.

SUMMARY OF THE INVENTION

The object of the invention is therefore to provide a body for positioning and protecting the connecting pins of a connector, in which the danger of undesired removal of the body is effectively prevented without the disadvantages of close tolerances and relatively high forces on the connecting pins during the fitting of the body and by maintaining the possibility that the body is able to slide in the direction of the connecting pins for the purpose of mounting the connector on a printed circuit board.

According to the invention this object is achieved in that, after fitting the body over the connecting pins, one or more of the parts of the body extending between the connecting pins being plastically deformed such that a barrier is formed to prevent the removal of the body.

Because according to the invention the barrier formed by deforming one or more of the parts of the body extending between the connecting pins can be provided after fitting the body, there is essentially no need for clamping-fit through openings of the body. These openings can consequently be quite adequately dimensioned within the tolerance range of the thickness of the connecting ends of the connector and the dimensions of the through openings of body. It will be clear that such relatively ample dimensions have a beneficial effect on the force needed to fit the body, which is accordingly lower than if clamping-fit openings are used. Because said barrier extends in the space between the connecting pins situated at a predetermined pitch distance from one another, the requirement of making the body slidable can easily be fulfilled.

In an embodiment of the connector according to the invention in which the contact elements are arranged in rows and columns and, when viewed in the mounted state of the connector on a printed circuit board, the contact elements in a row extend along the board surface and the contact elements in a column extend transversely on the board surface, the body comprises a wall part from which columnar parts extend between the columns of connecting pins, one or more of said columnar parts being deformed to form said barrier.

The columnar parts concerned may be provided with a thickened section extending in the row direction of the contact elements and situated between two or more rows of connecting pins. Preferably, such a thickened section extends, when viewed in the mounted state of the connector on a printed circuit board, between the uppermost and lowermost two rows of connecting pins. The body may also be provided with columnar parts extending between the rows of connecting pins instead of between the columns. In an embodiment thereof, the barrier consists of thickened sections extending in the column direction of the contact elements.

The thickened sections can easily be formed by exerting a deforming force on the columnar parts concerned from the outside.

In yet a further embodiment of the connector according to the invention, the columnar parts are so designed that they extend entirely or partially beyond the connecting pins in a column or row and are provided with a thickened section extending in the row direction or column direction, respectively, of the contact elements in this region.

Because the thickened sections concerned extend not between but beyond the connecting pins of a connector, they do not present an obstacle in making the body capable of sliding. This in view of to mounting on a printed circuit board, as described above.

In order to occupy as little space as possible at the connecting side of the connector and to take account of mechanical considerations, in one embodiment of the connector columnar parts adjacent to the connecting side of the connector housing are with a section extending beyond the connecting pins and being deformed to form a thickened section.

In order to prevent the body from being able to come loose in an undesired manner after it has been fitted between the connecting pins and before the formation, according to the invention, of the barrier, it is preferable to design one or more through openings of the body for receiving connecting pins situated adjacently to the connecting side of the connector housing as a clamping fit in a further embodiment of the invention wherein the wall part of the body from which the columnar parts extend is provided with through openings which are situated so as to correspond to the connecting ends or a group of connecting ends of the connecting pins and through which openings the connecting ends extend in the mounted state of the body.

In order to make it possible to clean the solder joints after assembling the connector on a printed circuit board, for example to rinse away residues of flux and soldering agent and the like, in an embodiment of the invention, the bottom section of the body is provided with a raised section which extends outwards. Preferably said raised sections increase in length in the direction remote from the connecting side of the connector housing in order to achieve as effective a cleaning as possible.

The invention also relates to a body of plastically deformable synthetic material for mounting on the connecting side of a connector as described above, and also to a method of mounting such a body which is characterised by the steps of:
positioning the body such that said parts thereof can be brought between the connecting pins,
fitting the body on the connecting side of the connector, and
plastically deforming one or more of the parts concerned.

Preferably, said parts are deformed cold. In contrast to deformation with heat being supplied, cold deformation has the advantage that no synthetic material adheres to the deforming tool, that no (harmful) gases can be released, as a result of which no measures are needed to extract them, and that no temperature control needs to be carried out, nor that the equipment and the like associated therewith has to be provided.

In order to avoid cracks in the synthetic material, only relatively small deformations are permitted with cold deformation, bun this is no drawback for the object of the invention because the deformations or thickened sections concerned only have to form a barrier to prevent the undesired removal, through sliding-off or the like, of the body after mounting on the connector.

Within the scope of the invention, the term "printed circuit board" referred to above should be understood as meaning any substrate to which the connecting ends of a connector can be connected, that is to say, for example, even the substrate of a liquid crystal display or the like.

The invention is illustrated in greater detail below by reference to various embodiments.

BRIEF DESCRIPTION OF THE DRAWINGS

FIGS. 1 and 2 show diagrammatically a section through a connector with a body for positioning the connecting ends of the connecting pins prior to and in the mounted state on a printed circuit board, respectively, according to U.S. Pat. No. 4,686,607.

FIGS. 3, 4 and 5 show diagrammatically various sectional views of a connector with a body according to the invention fitted to the connecting side prior to the deformation of said body.

FIGS. 9a–c and 10a–c show diagrammatically further embodiments of a body according to the invention.

FIG. 1 shows a cross section through a connector according to the prior art, provided with a housing 1 of synthetic material having channels 2 in which contact elements 3 of electrically conducting material extend. The contact elements 3 are arranged in rows and columns, the rows being viewed as extending transversely to the plane of the drawing and the columns as lying in the plane of the drawing.

Figure 5:
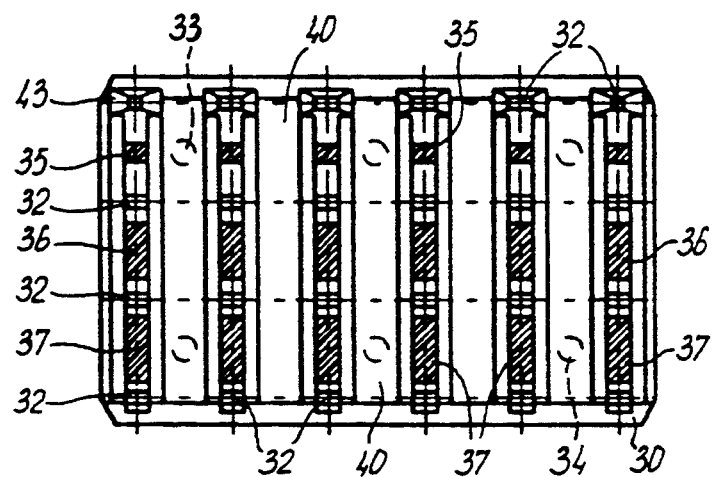

In the embodiment shown, said contact elements 3 are designed as a socket contact for receiving a further connector (not shown) from the contact side 4. Instead of being designed as a socket contact, the contact elements 3 may also be designed as a plug contact for making contact with a further connector provided with a socket contacts at the contact side 4 of the connector. Of course, the connector may also contain a combination of socket contact elements and plug contact elements.

Extending from the connecting side 5 of the connector 1 are connecting pins 6–9 which are electrically connected to the contact elements 3 and which each have a connecting end 10 bent through a right angle for mounting on a printed circuit board. In the exemplary embodiment shown, the connecting ends 10 are designed for the so-called pin/hole solder mounting on a printed circuit board.

For the purpose of attaching the connector to a printed circuit board, the housing 1 is provided with synthetic retaining pins 11 and positioning pins 12. The housing is furthermore provided with a device 13 for receiving coding elements for selective by contacting connectors.

Extending between the connecting ends 10 of the connecting pins 6–9 is a synthetic body 15 which is provided with a bottom section 16 having through openings 17 for receiving the connecting ends 10. The body 15 furthermore comprises partitions 18, 19, 20 which extend transversely to the plane of the drawing between the connecting ends 10 of, respectively, the connecting pins 6 and 7, 7 and 8, and 8 and 9.

One or more of the through openings 17 in which the connecting ends of the shortest connecting pins 6 extend have dimensions such that the connecting ends 10 concerned fit therein with a clamping action. The remaining through openings 17 are of such dimensions that the connecting ends 10 can move freely therein. The clamping fit of the connecting ends 10 of the shortest connecting pins 6 of the connector provides sufficient retaining force to hold the body 15 in the protecting position shown during transport and assembly of the connector.

As already mentioned above, the body 15 is referred to as a "wafer".

FIG. 2 shows a similar section to that in FIG. 1, but in this case the connector is mounted on a printed circuit board 21, the connecting ends 10 of the connecting pins 6–9 extend into the openings 22 and are connected by means of solder joints 23 in an electrically conducting manner to terminal pads 24 of the printed circuit board 21. The retaining pin 11 of the housing 1 extends into a corresponding through opening 26 of the board 21 and has been upset by hot upsetting to produce a fixing head 25.

It can be clearly seen that the body 15 is pushed in the direction of the connecting pins 6–9, the bottom part 16 being held by raised parts or spacers 27, 28 at a distance from the printed circuit board 21.

In the position of the body 15 shown in FIG. 1, said body 15 ensures that the connecting ends 10 are held at their predetermined pitch distance, corresponding to the mutual pitch distance of the openings 22 of the printed circuit board 21. By holding the connecting ends 10 at a correct mutual position in this way, the assembly on the board 21 is appreciably simplified, making assembly with an assembly robot possible.

The raised parts 27 and 28 ensure that any residues of the flux used in the soldering process and residues of solder under the bottom section 16 can be rinsed away without the risk of corrosive impurities being left behind or short-circuiting between the connecting ends 10 by soldering material left behind. In the situation shown in FIG. 2, the body 15 does not in fact any longer have a function.

FIG. 3 shows a similar section to FIGS. 1 and 2, but in this case a body 30 according to the invention is mounted on the connecting side 5 of the connector, which body 30 surrounds not only the connecting ends 10 but also the connecting pins 6–9.

Formed in the bottom part 31 of the body 30 are through openings 32 into which the connecting ends 10 of the connecting pins 6–9 extend. Raised sections 33, 34 again project outwards from the bottom part 31, which raised parts, like the raised parts 27 and 28 shown in FIGS. 1 and 2, increase in length in the direction remote from the connecting side 5 of the connector housing. Viewed in the direction transverse to the plane of the drawing, triangular partitions 35, 36, 37 extend from the bottom part 31 between the connecting ends 10 of the connecting pins 6–9, the partition 37 extending up to the vicinity of the connecting pins 9.

FIG. 4 shows a cross section along the line IV—IV in FIG. 3. It can clearly be seen that columnar parts 40 bounded by outermost side walls 38, 39 of the body 30 extend between the columns of connecting pins 6–9. FIG. 4 shows the body 30 prior to the deformation, according to the invention, of the columnar parts 40 to form a barrier to hold the body 30 in the mounted state.

To perform the deformation, a device is provided which comprises pins 41 which are able to press with force on the columnar parts 40 in the direction of the arrows 42.

FIG. 3 is the section along the line III—III in FIG. 4. It can clearly be seen that the pins 41 are positioned in such a way that they are able to deform the columnar parts 40 in the region between the connecting pins 8 and 9.

FIG. 5 shows a view of the body 30 along the line V—V fin FIG. 3, but in the unmounted state. As shown, the through holes 32 for receiving the connecting ends 10 of the connecting pins 6 can be of constricted design, as indicated by the reference numeral 43, for the receiving therein of the connecting ends 10 with a clamping action in order to prevent the body from sliding off prior to the deformation of the columnar elements 40.

Figure 6:
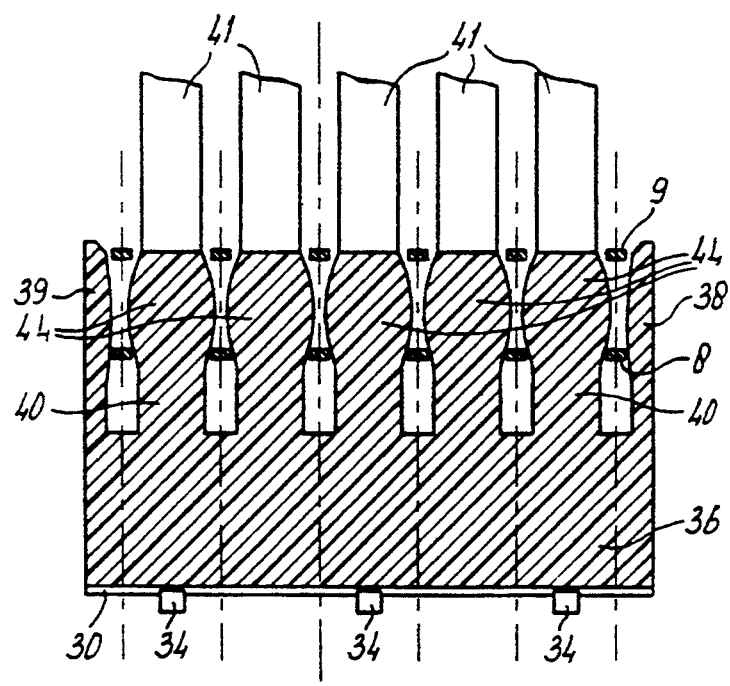
FIG. 6 shows diagrammatically a sectional view of the body in accordance with FIG. 4 after the deformation thereof.

FIG. 6 shows a similar section to that in FIG. 4, but after the deformation of the columnar parts 40 by the pins 41 to form a thickened section 44 which extends in the row direction of the contact elements. These thickened sections form an effective barrier for preventing the bodies 30 from sliding off over the connecting ends 10. The dimensions of the thickened sections 44 are such that the body 30 has sufficient freedom of movement to be able to move along the connecting ends 10 for the purpose of mounting on a printed circuit board.

Although FIGS. 4 and 6 show a device having pins 41 which can deform each of the columnar parts 40, it is possible, if desired, to make do with deforming some of the columnar parts, for example the outermost and central columnar parts 40.

Figure 7:
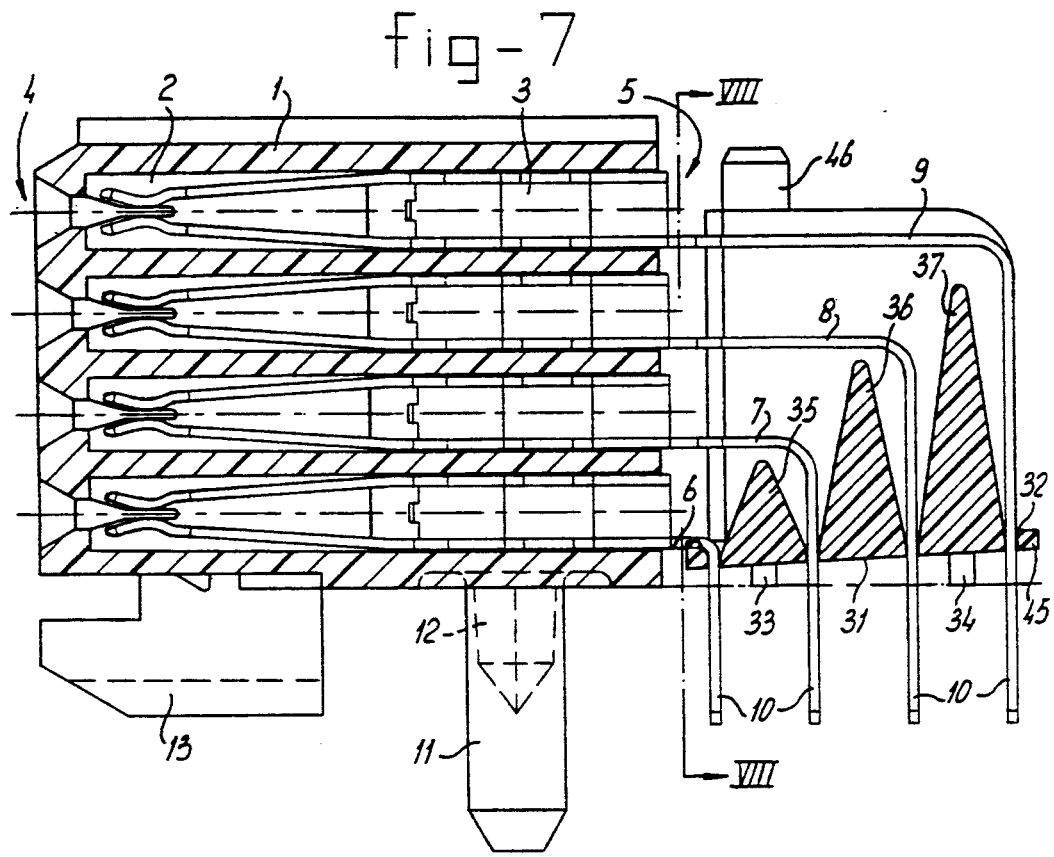
FIG. 7 shows diagrammatically a sectional view of a connector provided with a further embodiment of the body according to the invention.

FIG. 7 shows a similar section to that in FIG. 3, but with a further embodiment of the body 45 according to the invention. The columnar parts 40 are in this case provided with a section 46 extending beyond the connecting pins 9.

Figure 8:
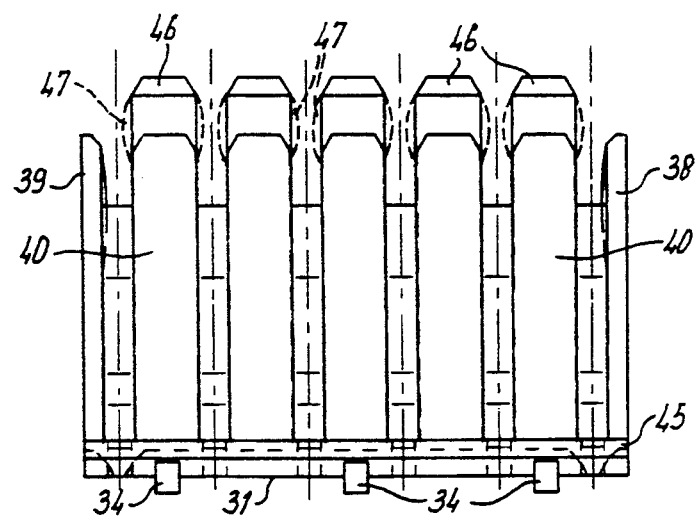
FIG. 8 shows diagrammatically a view towards the body shown in FIG. 6.

FIG. 8 shows a view of the body 45 along the line VIII—VIII in FIG. 7, but in the unmounted state thereof. It can be clearly seen that each of the columnar elements 40 is provided with a projection 46 which can be deformed in a similar way to that shown in FIG. 5 by means of a device with pins 41 to form a thickened section 47 extending in the row direction of the contact elements 3, as shown by the broken lines in FIG. 8.

This embodiment of the body 45 has the advantage that it can easily be moved along the connecting ends 10 without being impeded by the thickened sections 47, with the result that said body 45 can be held relatively close to the soldering ends of the connecting ends 10 in the unmounted state of the connector and a maximum protection can be offered against both mechanical and electrical deformation of the connecting pins 6–9 and their connecting ends 10.

Figure 9A:
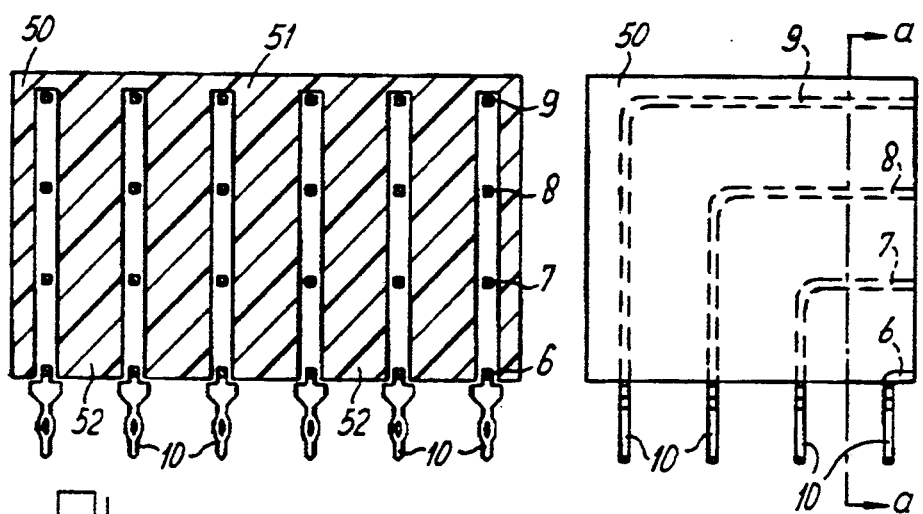

FIGS. 9a, b, c show a further embodiment of a body 50 according to the invention, in which, for the sake of simplicity, only the connecting pins 6–9 of the connector are shown. The diagrams shown in the right-hand part of the drawing are side views of the body 50 and the diagrams in the left-hand part of the drawing show sections along the lines a—a, b—b and c—c, respectively.

As can be seen in FIG. 9a, the still undeformed body is fitted from the direction of the connecting pins 9, columnar parts 52 projecting between the columns of connecting pins 6–9 from the wall part 51.

Figure 9B:
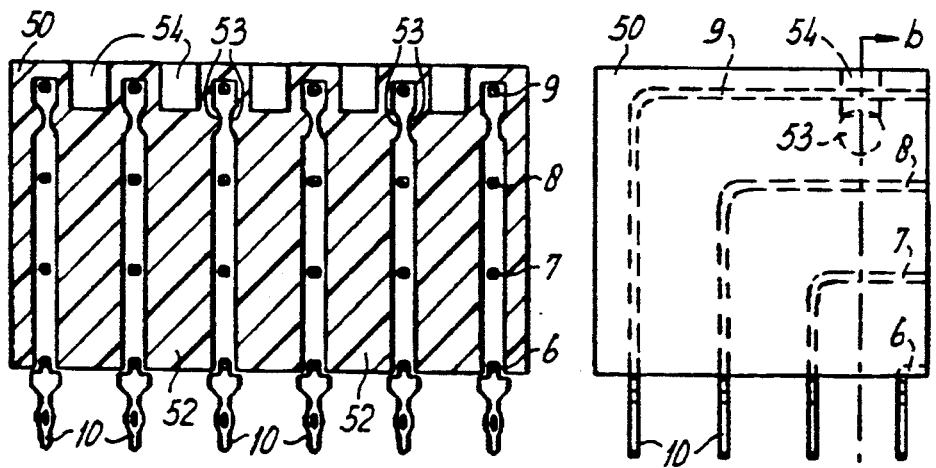

FIG. 9b shows the body 50, in which thickened sections 53 in accordance with the invention have been formed from the wall part 51 in the columnar parts 52. The thickened sections 53 concerned can be provided in a similar way to that described by reference to FIGS. 3, 4 and 6 by means of pins 41. The reference numeral 54 shows the positions at which the pins 41 have acted on the body 50 to deform the columnar parts 52. The thickened sections 53 extend in the row direction between the connecting pins 8 and 9.

Figure 9C:
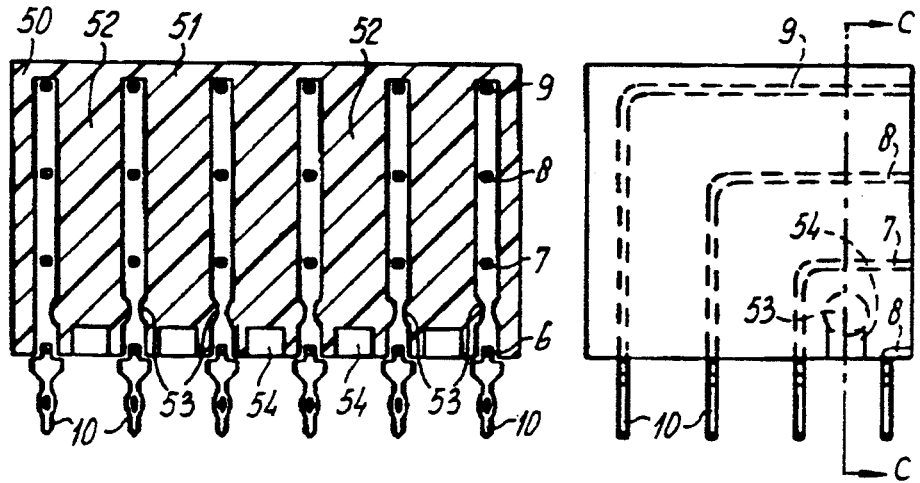

The thickened sections 53 may also be provided between the lowermost connecting pins 6 and 7, as shown in FIG. 9c, instead of between the uppermost connecting pins 8 and 9.

FIGS. 10a, b, c show, in a similar way to FIG. 9, views and sections of yet a further embodiment of a body 60 according to the invention. As can be seen in FIG. 10a, columnar parts 62 extend from a wall part 61 of the body 60 in the row direction, instead of in the column direction, between the connecting pins 6–9. The columnar body 60 is fitted, over the connecting pins 6–9 from the side of the connector.

FIG. 10b shows the body 60 provided with thickened sections 63 which are formed at the free ends of the columnar parts 62 between the outermost two columns of connecting pins 6–9 as seen from the wall part 61 of the body 60. The thickened sections 63 extend in the column direction. The recesses 64 again show the position of the tool for forming the thickened section 63, for example the pins 41 as shown in FIG. 3.

FIG. 10c shows an embodiment in which a barrier 65 is formed in a wall 66 of the body 60 in accordance with the invention. The barriers 63 and 65 may, of course, be used in combination. The bodies 30, 45, 50 and 60 are also referred to by the term "protected wafer".

In order to be able to cold-deform, that is to say without supplying additional heat, the columnar parts 40, 52, 62 concerned, it is preferable to construct the bodies concerned of plastically deformable synthetic material.

It is obvious that the bodies should be effectively supported while performing the deformation in order to prevent deformation of the connecting pins 6–9.

Although cold deformation is to be preferred, deformation of the columnar parts with local heating is, of course, also possible.

We claim:

1. An electrical connector, comprising a housing of electrically insulating material provided with a plurality of contact elements of electrically conducting material, each having a contact side for making contact to a further connector and a connecting side in the form of connecting pins extending outside the housing and having a connecting end for mounting on a printed circuit board, and having a body of plastically deformable synthetic material provided with parts which extend between said connecting pins, wherein, after fitting the body over the connecting pins, one or more of the parts of the body extending between the connecting pins being plastically deformed such that a barrier is formed to prevent removal of the body with the body being slidable on the connecting pins.

2. An electrical connector according to claim 1, wherein said wall part of the body is provided with through openings which are situated so as to correspond to the connecting ends or a group of connecting ends of the connecting pins and through which openings said connecting ends extend in the mounted state of the body, and in which one or more of the through openings for the receiving of connecting pins situated adjacently to the connecting side of the connector housing being designed as a clamping fit.

3. An electrical connector according to claim 1, wherein the body is provided with raised sections extending outwards on the side facing the connecting ends of the connecting pins in the mounted state.

4. An electrical connector according to claim 1, wherein the contact elements are arranged in rows and columns, such that when viewed in the mounted state of the connector on a printed circuit board, the contact elements in a row extend along the board surface and the contact elements in a column extend transversely on the board surface, said body comprises a wall part from which columnar parts extend between the columns of connecting pins, and one or more of said columnar parts being deformed to form said barrier.

5. An electrical connector according to claim 4, wherein one or more of the columnar parts being provided, in a region extending between one or more of the connecting pins, with a thickened section extending in the row direction of the contact elements and forming said barrier.

6. An electrical connector according to claim 5, wherein the thickened sections extend, when viewed in the mounted state of the connector on a printed circuit board, in the region of the connecting pins between the lowermost two rows of contact elements.

7. An electrical connector according to claim 5, wherein the thickened sections extend, when viewed in the mounted state of the connector on a printed circuit board, in the region of the connecting pins between the uppermost two rows of contact elements.

8. An electrical connector according to claim 7, wherein one or more of the columnar parts being provided, in a region extending between one or more of the connecting pins, with a thickened section extending in the column direction of the contact elements and forming said barrier.

9. An electrical connector according to claim 8, wherein the thickened sections extend, when viewed in the mounted state of the connector on a printed circuit board, in the region between the uppermost two rows of connecting pins.

10. An electrical connector according to claim 8, wherein the thickened sections extend, when viewed in the mounted state of the connector on a printed circuit board, in the region between the lowermost two rows of connecting pins.

11. An electrical connector according to claim 4, wherein one or more of the columnar parts extends or extend entirely or partially beyond the connecting pins in a column and being provided with a thickened section extending in the row direction of the contact elements in this region.

12. An electrical connector according to claim 11, wherein columnar parts adjacent to the connecting side of the connector housing are provided with a section extending beyond the connecting pins and being deformed to form a thickened section.

13. An electrical connector according to claim 1, wherein the contact elements are arranged in rows and columns, such that when viewed in the mounted state of the connector on a printed circuit board, the contact elements in a row extend along the board surface and the contact elements in a column extend transversely on the board surface, said body comprises a wall part from which columnar parts extend between the rows of connecting pins, and one or more of said columnar parts being deformed to form said barrier.

14. An electrical connector according to claim 13, wherein one or more of the columnar parts extends or extend entirely or partially beyond the connecting pins in a row and being provided with a thickened section extending in the column direction of the contact elements in this region.

15. An electrical connector according to claim 14, wherein columnar parts adjacent to the connecting side of the connector housing are provided with a section extending beyond the connecting pins and being deformed to form a thickened section.

* * * * *